(12) United States Patent
Benzel et al.

(10) Patent No.: US 6,395,574 B2
(45) Date of Patent: May 28, 2002

(54) MICROMECHANICAL COMPONENT AND APPROPRIATE MANUFACTURING METHOD

(75) Inventors: Hubert Benzel, Pliezhausen; Frank Schaefer, Tuebingen; Heinz-Georg Vossenberg, Pfullingen, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/858,805

(22) Filed: May 16, 2001

(30) Foreign Application Priority Data

May 17, 2000 (DE) .......................... 100 24 266

(51) Int. Cl.[7] .............................................. H01L 21/00
(52) U.S. Cl. ................................... 438/53; 257/419
(58) Field of Search ......................... 438/50, 51–53, 438/800; 216/2; 257/414, 419, 415–418; 361/283.4

(56) References Cited

U.S. PATENT DOCUMENTS 5,493,470 A  *  2/1996  Zavracky et al. ........ 361/283.4

OTHER PUBLICATIONS

Scheiter et al., *Sensors and Actuators*, International Journal, vol. A 67, 1998, pp. 211–214.

* cited by examiner

*Primary Examiner*—Keith Christiansen
*Assistant Examiner*—Craig Thompson
(74) *Attorney, Agent, or Firm*—Kenyon & Kenyon

(57) ABSTRACT

A micromechanical component, particularly a pressure sensor, includes a substrate, made of semiconductor material; a functional layer provided epitactically on substrate; a hollow space being provided between substrate and functional layer defining a diaphragm region of functional layer; and below diaphragm region, on substrate, one or more spacers being provided, for preventing adhesion of diaphragm region to substrate during deformation. Also described is an appropriate manufacturing method.

15 Claims, 6 Drawing Sheets

MICROMECHANICAL COMPONENT AND APPROPRIATE MANUFACTURING METHOD

FIELD OF THE INVENTION

The present invention relates to a micromechanical component and an appropriate manufacturing method. The present invention as well as the underlying problem are explained with respect to a micromechanical pressure sensor in the manufacturing technology of surface micromechanics, although they could theoretically be applied to any micromechanical structural components.

BACKGROUND INFORMATION

In known methods heretofore, there is a capacitive pressure sensor in surface micromechanical technologies (OMM) which uses a costly and tedious etching process for etching out sacrificial oxide, in order to prevent sticking of the diaphragm to the underlying cavity bottom (see also, T. Scheiter et al., Sensors and Actuators A 67 (1998), 211–214). This etching process consists in a repetitive sequence of 10 sec etching intervals in HF gas and subsequent rinsing in nitrogen.

Piezoresistive pressure sensor elements in OMM technology with structured polycrystalline resistors have not been published up to now. In the known pressure sensor elements, the piezoresistive resistors are diffused into a monocrystalline silicon layer.

The known pressure sensors up to now are adapted to various pressure regions by varying the diaphragm size, since the thickness of the diaphragm is preselected by the particular process used.

SUMMARY OF THE INVENTION

The micromechanical component according to the present invention or the corresponding manufacturing method according to the present invention has the advantage compared to known attempts of a solution, that a simple design of a pressure sensitive micromechanical component having a membrane is created. Adaptation to different pressure regions can occur by changing a single process step, namely of the epitaxy thickness of the functional layer. Adaptation of the lithography masks, as with known methods, is not required.

One idea on which the present invention is based, is that, between the substrate and the functional layer a cavity is provided, which defines a diaphragm region of the functional layer, and below the diaphragm region on the substrate, one or a plurality of spacers are provided, to prevent adhesion of the diaphragm region to the substrate during deformation.

By using such expediently pyramid-shaped spacers in the cavity, the sticking problem during gas phase etching can be prevented. The spacers in the cavity even permit doing without costly gas phase etching processes for dissolving out the sacrificial layer from the cavity. During the etching process, the spacers prevent the diaphragm from being drawn to the bottom of the cavity by the surface tension of the water produced during etching, and sticking to it. Through this, the etching rate can be markedly increased, and thus the processing time reduced. This permits also arriving at the large lateral etching depths for this design in acceptable time.

According to a preferred further refinement, in the diaphragm region on the functional layer, and insulated by an insulating layer, polycrystalline, piezoresistive printed circuit traces are provided, made of semiconductor material.

According to another preferred improvement thereto, in the diaphragm region and/or the periphery of the diaphragm region, stoppered etching channels are provided for etching a sacrificial layer defining the cavity, the insulating layer in the region of the etching channel having corresponding holes whose sidewalls are covered by the material of the printed circuit trace. The insulating layer under the polycrystalline resistors is covered laterally by polycrystalline silicon in the region of the etching channels. Without this covering, the insulating layer under the polycrystalline resistors would be etched away too, during the etching away of the sacrificial layer of the cavity, whereby the resistors would lift off.

According to yet another preferred further refinement, the semiconductor material is silicon.

According to still another preferred further refinement, the sacrificial layer and the insulating layer are a first and second silicon dioxide layer.

A further underlying idea of the present invention is that the following steps are carried out for manufacturing a micromechanical component having a diaphragm, as for instance a pressure sensor: Preparation of a substrate from a semiconductor material; providing a sacrificial layer on the substrate; structuring the sacrificial layer so as to define a later-formed cavity having an overlying diaphragm region; epitactic provision of a functional layer made of the semiconductor material on the substrate having the structured sacrificial layer; providing an insulating layer on the functional layer; providing etching channels in the diaphragm region and/or in the periphery of the diaphragm region for etching the sacrificial layer; etching the sacrificial layer; sealing the etching channels; and providing one or more spacers to prevent sticking of the diaphragm region to the substrate caused by deformation below the diaphragm region onto the substrate.

During etching away the sacrificial layer of the cavity, the design according to the present invention requires great lateral etching depth. In order to reach acceptable processing time, a high etching rate is desirable. Subject to the process, this produces relatively much water. Without special measures being taken, this would cause the diaphragm to be drawn to the cavity bottom by surface tension. Because of the close touching of the two surfaces over a large area, strong cohesion forces would be created, which would prevent releasing of the diaphragm from the cavity bottom after evaporation of the water. The spacers proposed within the framework of the present invention prevent sticking of the diaphragm to the bottom of the cavity. The surface tension of the water can draw the diaphragm down only up to the point where it rests on the spacers. The area over which diaphragm and spacers touch is very small. The small cohesion forces resulting from this can be overcome by the inner tension of the diaphragm, i.e., the diaphragm snaps back after evaporation of the water.

The method delineated here makes possible relatively simple and cost-effective manufacturing, using existing OMM process steps. Using this design, a clear reduction in size of the sensor element is possible. A considerable advantage comes about because the sensor element is adapted to other pressure ranges merely by changing layer thickness. The epitaxy thickness essentially determines the thickness of the diaphragm, and thus, how much the diaphragm is bent by an applied pressure. A thicker diaphragm requires a higher pressure for attaining a certain amount of deformation, and thereby a certain output signal. Particularly, the sensor element is also suitable for higher pressures.

One design element represents the structuring forward of the sacrificial material. It creates an etching stop during etching out of the cavity sacrificial material. The lateral dimension of the cavity is defined by the sacrificial layer. That stops the etching process laterally, whereby the position of the diaphragm edges is exactly defined. The forward structuring of the sacrificial material permits, in addition, the definition of lateral etching channels outside the cavity. The channels speed up the etching out of the sacrificial material, because, in addition to the etching channels in the middle of the diaphragm, the sacrificial material is also etched out by the lateral channels.

According to a preferred further refinement, provision is made of polycrystalline, piezoresistive printed circuit traces made of the semiconductor material in the diaphragm region on the insulating layer.

According to a preferred further refinement, the etching channels are provided using the following steps: Forming of holes in the insulating layer; providing a layer made of the printed circuit trace material on the insulating layer having the holes; depositing a protective layer on the layer made of the printed circuit trace material; forming of holes in the protective layer within the holes; and transferring the holes into the functional layer to form the etching channels.

In keeping with another preferred further refinement, the protective layer, the insulating layer and the sacrificial layer will be made of the same material.

According to yet another preferred further refinement, the semiconductor material is silicon. Before providing the sacrificial layer, the following steps are executed: Providing a silicon nitride layer on the substrate; structuring the silicon nitride layer in such a way that spots of the silicon nitride layer remain in the cavity to be formed later; thermally oxidizing the substrate with the spots of the silicon nitride layer, so that, under the spots of the silicon nitride layer, spacers for preventing adhesion of the diaphragm region to the substrate, during deformation, are formed from non-oxidized substrate material; and removing the silicon nitride layer. Optionally, then, thermal oxidizing can still be performed, in order to increase the clearance between the tip of the pyramids and the upper edge of the oxide.

In accordance with still another preferred further development, after etching the sacrificial layer above the layer made of the printed circuit trace material, a sealing layer for sealing the etching channels is deposited, and structured in such a way that the etching channels are sealed by plugs made of the sealing layer.

According to another preferred further refinement, the printed circuit traces are structured from the layer made of the printed circuit trace material, after the sealing of the etching channels.

DETAILED DESCRIPTION

In the figures, the same reference numerals denote the same or functionally the same component parts.

FIGS. 1a–m shows a schematic cross-sectional illustration of the process steps for manufacturing a micromechanical component according to a first specific embodiment of the present invention.

Figure 1:
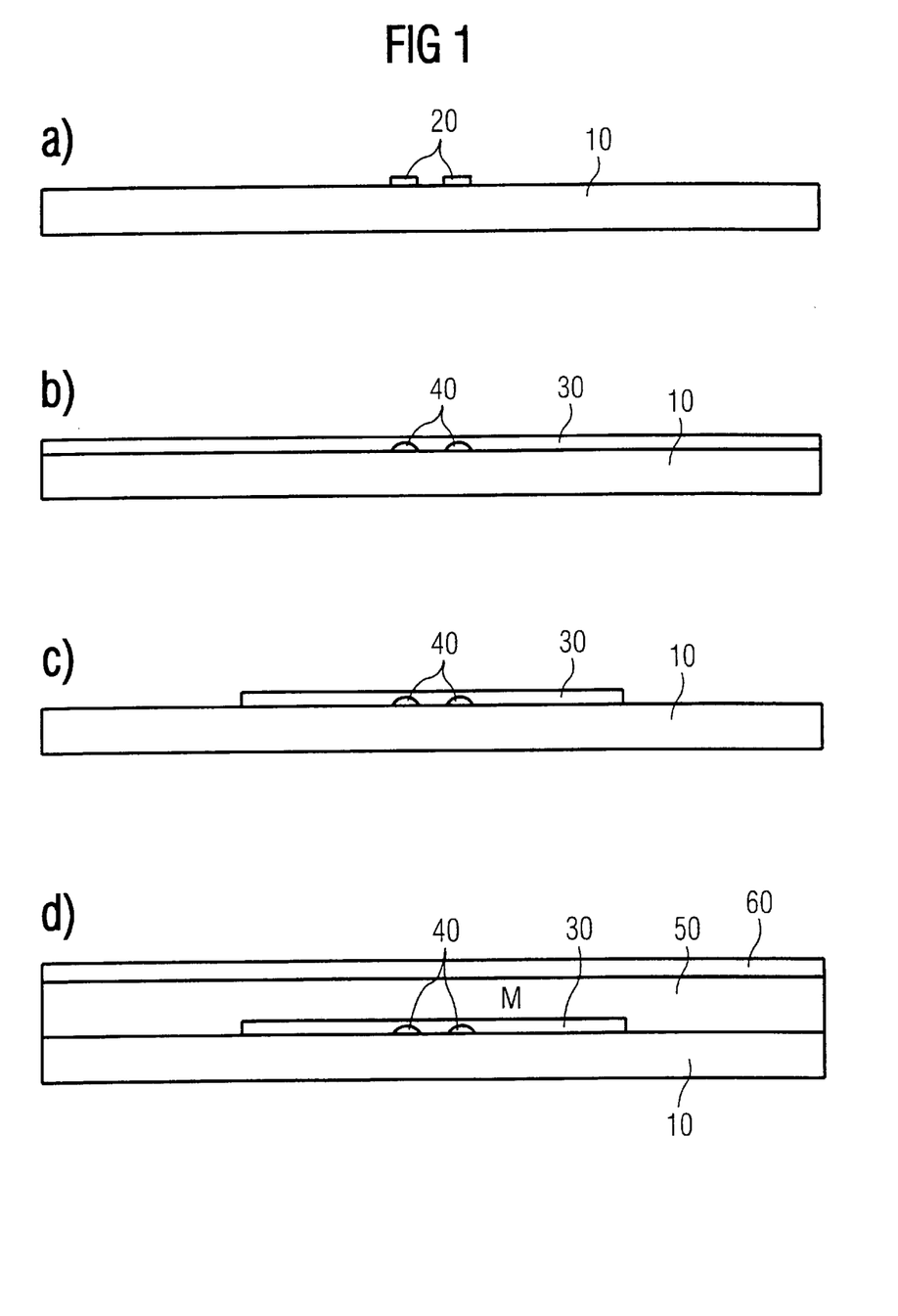
FIG. 1a shows a schematic cross-sectional illustration of the process steps for manufacturing a micromechanical component according to a first specific embodiment of the present invention.
FIG. 1b shows another schematic cross-sectional illustration of the process steps for manufacturing a micromechanical component according to the first specific embodiment of the present invention.
FIG. 1c shows another schematic cross-sectional illustration of the process steps for manufacturing a micromechanical component according to the first specific embodiment of the present invention.
FIG. 1d shows another schematic cross-sectional illustration of the process steps for manufacturing a micromechanical component according to the first specific embodiment of the present invention.
FIG. 1e shows another schematic cross-sectional illustration of the process steps for manufacturing a micromechanical component according to the first specific embodiment of the present invention.
FIG. 1f shows another schematic cross-sectional illustration of the process steps for manufacturing a micromechanical component according to the first specific embodiment of the present invention.
FIG. 1g shows another schematic cross-sectional illustration of the process steps for manufacturing a micromechanical component according to the first specific embodiment of the present invention.
FIG. 1h shows another schematic cross-sectional illustration of the process steps for manufacturing a micromechanical component according to the first specific embodiment of the present invention.
FIG. 1i shows another schematic cross-sectional illustration of the process steps for manufacturing a micromechanical component according to the first specific embodiment of the present invention.
FIG. 1j shows another schematic cross-sectional illustration of the process steps for manufacturing a micromechanical component according to the first specific embodiment of the present invention.
FIG. 1k shows another schematic cross-sectional illustration of the process steps for manufacturing a micromechanical component according to the first specific embodiment of the present invention.
FIG. 1l shows another schematic cross-sectional illustration of the process steps for manufacturing a micromechanical component according to the first specific embodiment of the present invention.
FIG. 1m shows another schematic cross-sectional illustration of the process steps for manufacturing a micromechanical component according to the first specific embodiment of the present invention.

With reference to FIG. 1a, a substrate 10 in the form of a silicon wafer is first provided. On the entire area of the surface of substrate 10 silicon nitride 20 is deposited, and in a subsequent photolithography step it is structured so as to form silicon nitride spots 20.

Following that, as illustrated in FIG. 1b, thermal oxidation of the surface of substrate 10 is performed by the spots of silicon nitride. This causes pyramids of monocrystalline silicon to form under the spots of silicon nitride 20, since, during this selective oxidation, oxygen diffuses into the silicon substrate 10, but does not diffuse through the nitride spots 20. And so, in the area of the spots of silicon nitride 20, there is only a lateral underdiffusion, which leads to the formation of pyramids 40. Following that, the nitride is removed.

The silicon dioxide 30, thus formed, is later used as sacrificial layer for forming a hollow space or cavity under the diaphragm of the pressure sensor.

As shown in FIG. 1c, the sacrificial oxide 30 is structured in a subsequent process step. The remaining portion of sacrificial oxide 30, shown in FIG. 1c, exactly defines the cavity of the pressure sensor.

According to FIG. 1d, in a subsequent step silicon is grown epitactically over the entire surface, and covered with a second oxide layer 60. The thickness of the grown silicon layer 50, which is also denoted as functional layer, essentially determines the thickness of diaphragm region M of the pressure sensor.

With reference to FIG. 1e, in a further process step, holes 70 in the second oxide layer 60 are then formed above the diaphragm region M. Subsequently, a polycrystalline silicon layer 50 is superposed on the resulting structure, and doped either in situ or later. In this polycrystalline silicon layer 80 the piezoelectric resistors of the pressure sensor are structured in the further course of the process, as is explained further down.

With reference to FIG. 1f, a metallization of the entire area of the resulting structure is then performed, e.g. with aluminum, and in this metal layer contact pads 90 are formed, at the edge of the sensor element, for later connection to the piezoresistive resistors 400 to be structured from polycrystalline layer 80.

In relation to FIG. 1g, a protective layer 100 is deposited over the entire area of the resulting structure in a subsequent process step, which also consists, for example, of oxide or nitride. This is, thereafter, structured in such a way, that within holes 70 of second oxide layer 60 holes 70' of this protective layer 100 are formed. The purpose of protective layer 100 is to protect the remaining surface during a subsequent etching process.

With reference to FIG. 1h, in this subsequent etching process, which can be an anisotropic plasma etching process, the holes 70' are transferred into the diaphragm region down to the sacrificial oxide. This produces etching channels 110 for the subsequent etching of the sacrificial layer of sacrificial oxide 30, which at this moment still fills the cavity.

With reference to FIG. 1i, in the next step the sacrificial oxide 30 is etched out, in order to form the hollow space, or rather the cavity. If protective layer 100 should also consist of silicon dioxide, then this protective layer will also be etched away during this etching step. Otherwise this upper protective layer 100 would have to be etched away by a separate etching process. Since doped polycrystalline silicon layer 80 covers, in holes 70 of second oxide layer 60, the edges of oxide layer 60 lying below these, this second oxide layer 60 is protected during the etching of the sacrificial layer. During this etching step the pyramid-shaped spacers 40 are of great importance. For, an important problem in the field of surface micromechanics is this "sticking" during the etching out of sacrificial oxide 30. Because, as it happens, during etching, drops of water form, which, based on their surface tension, draw together neighboring silicon regions, i.e. the silicon of diaphragm region M and of substrate 10. Without any spacers 40, diaphragm region 10 would be drawn to the diaphragm bottom. Even after drying of the water, diaphragm region M would adhere to the bottom on account of cohesion forces now acting over a large area. The pyramid-shaped spacers 40 formed here, prevent this sticking or adhesion of diaphragm region M to the bottom, since after drying of the water, diaphragm region M adheres exclusively to the pyramid tips of spacers 40. The restoring force of diaphragm region M is here large enough to overcome the cohesion forces effective in the small contact area diaphragm/pyramid tip.

Furthermore, the etching boundary is stopped by the forward structuring of sacrificial oxide 30 in the lateral direction, as soon as it meets the interface sacrificial oxide/silicon, which here forms an etching stop AS.

With reference to FIG. 1j, a sealing layer 120 is then deposited on the entire area of resulting structure. This sealing layer 120 can consist of oxide, nitride or another suitable material Simultaneously with this process step, the internal pressure or atmosphere of hollow space 300 is established Furthermore, protective layer 120 is then structured in such a way, that in the central region of diaphragm region M, where etching channels 110 are arranged, a bulge is created. Of course, it would also be possible to provide an understructuring of this bulge in such a way that only individual etching channels 110 are plugged by individual plugs from sealing layer 120.

With reference to FIG. 1l, thereafter the position and shape of the piezoresistive resistors 400 are defined, by customary photolithographic structuring.

Finally, according to FIG. 1m, the resulting structure is covered with a passivating layer 130, which is opened in the region of the contact pads 90 by a terminating photolithographic structuring.

Figure 2:
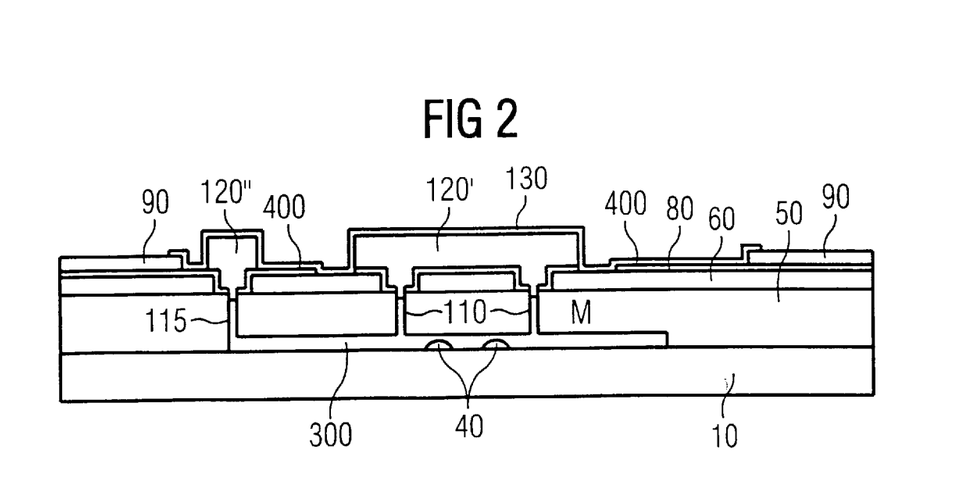
FIG. 2 shows a schematic cross-sectional illustration of a micromechanical component according to a second specific embodiment of the present invention, at the process stage corresponding to FIG. 1m.

FIG. 2 shows a schematic cross-sectional illustration of a micromechanical component according to a second specific embodiment of the present invention, at the process stage corresponding to FIG. 1m.

As illustrated in FIG. 2, additional etching channels 115 can also be formed in the edge region, or rather in the periphery of diaphragm region M, which then can be sealed by protective layer 120 with plugs 120", analogously to bulge 120' in the first specific embodiment. Of course, such etching channels 115 with plugs 120" should have sufficient clearance from piezoresistive resistors 400 so as not to influence their behavior.

Figure 3:
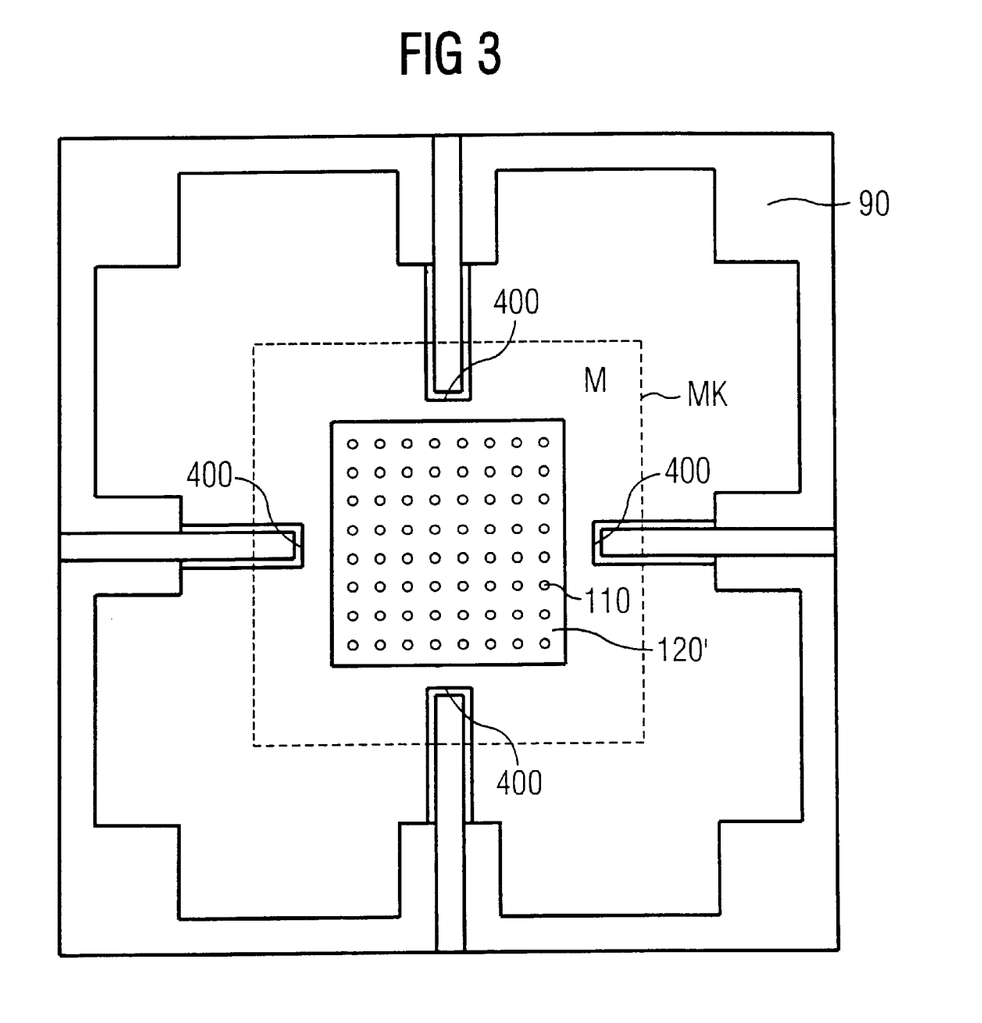
FIG. 3 shows a top view of the micromechanical component according to the first specific embodiment.

FIG. 3 shows a top view of the micromechanical component according to the first specific embodiment.

FIG. 3 makes clear the planar design of the pressure sensor according to the first specific embodiment. Four piezoresistive resistors 400 are provided, which are each U-shaped. Two neighboring piezoresistive resistors 400 are connected with each other diagonally by a common contact pad 90 to form a Wheatstone bridge. The dotted line in FIG. 3 indicates diaphragm edge MK. In other words, the hollow space lies within the region surrounded by the dotted line.

Figure 4:
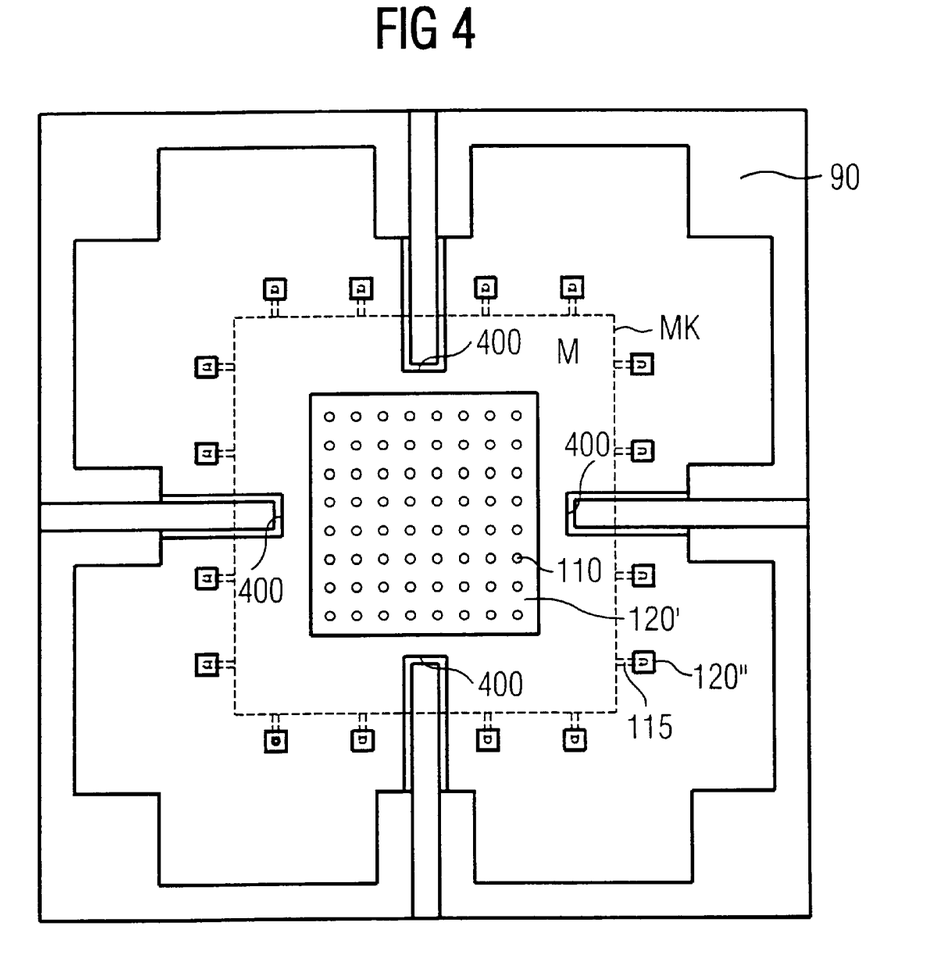
FIG. 4 shows a top view of the micromechanical component according to the second specific embodiment.

FIG. 4 shows a top view of the micromechanical component according to the second specific embodiment.

The top view according to FIG. 4 corresponds to the second specific embodiment according to FIG. 2, in which additional etching channels 115 are provided in the periphery of diaphragm region M, and which are sealed by plugs of protective layer 120". Other than that, the structures shown in FIG. 3 and FIG. 4 are the same.

Although the method of manufacture according to the present invention is described based on the aforementioned preferred exemplary embodiments, the method is not limited thereto, but can be modified in various ways.

Of course, it is possible to give the piezoresistive resistor elements any arbitrary form that departs from the U-shape. Etching channels 110 or 115 can also be arranged in a manner different from the illustrated form. The design of the connection of the piezoresistive resistor elements via contact pads 90 can, of course, also be varied at will.

As further variants, the pyramid-shaped spacers, the etching stop due to the forward structuring of the sacrificial oxide and the lateral etching channels can be used for a capacitive pressure sensor in OMM technology.

What is claimed is:

1. A micromechanical component, comprising:
   a substrate including a semiconductor material;
   a functional layer including the semiconductor material provided epitactically on the substrate, wherein:
   a hollow space is disposed between the substrate and the functional layer, the hollow space defining a diaphragm region of the functional layer; and
   at least one spacer arranged below the diaphragm region on the substrate and for preventing an adhesion of the diaphragm region to the substrate during a deformation.

2. The component according to claim 1, wherein:
   the component corresponds to a pressure sensor.

3. The component according to claim 1, further comprising:
   an insulating layer; and
   a plurality of polycrystalline piezoresistive printed circuit traces arranged in the diaphragm region on the functional layer, wherein:
   the plurality of polycrystalline piezoresistive printed circuit traces is insulated by the insulating layer and includes the semiconductor material.

4. The component according to claim 3, further comprising:
   a sealing layer; and
   a sacrificial layer, wherein:
   etching channels for etching the sacrificial layer defining the hollow space are plugged by the sealing layer and arranged in at least one of the diaphragm region and a periphery of the diaphragm region,
   the insulating layer includes, in a region of the etching channels, corresponding holes, and
   sidewalls of the holes are covered by a material of the plurality of polycrystalline piezoresistive printed circuit traces.

5. The component according to claim 1, wherein:
   the semiconductor material is silicon.

6. The component according to claim 4, wherein:
   the sacrificial layer is a first silicon dioxide layer, and
   the insulating layer is a second silicon dioxide layer.

7. A method for manufacturing a micromechanical component, comprising the steps of:
   preparing a substrate including a semiconductor material;
   providing a sacrificial layer on the substrate;
   structuring the sacrificial layer to define a hollow space and a diaphragm region arranged above the hollow space;
   epitactically providing a functional layer including the semiconductor material on the substrate including the sacrificial layer;
   providing an insulating layer on the functional layer;
   providing etching channels in at least one of the diaphragm region and a periphery of the diaphragm region for etching the sacrificial layer;
   etching the sacrificial layer;
   sealing the etching channels; and
   providing at least one spacer to prevent an adhesion of the diaphragm region to the substrate during a deformation below the diaphragm region onto the substrate.

8. The component according to claim 7, wherein:
   the component corresponds to a pressure sensor.

9. The method according to claim 7, further comprising the step of:
   providing polycrystalline piezoresistive printed circuit traces including the semiconductor material in the diaphragm region on the insulating layer.

10. The method according to claim 9, wherein the step of providing etching channels includes the steps of:
    forming first holes in the insulating layer,
    providing a layer including a material of the polycrystalline piezoresistive printed circuit traces on the insulating layer with the first holes;
    depositing a protective layer on the layer including the material of the polycrystalline piezoresistive printed circuit traces;

forming other holes in the protective layer inside the first holes; and transferring the other holes into the functional layer to form the etching channels.

11. The method according to claim 10, wherein:

the protective layer, the insulating layer, and the sacrificial layer are formed from the same material.

12. The method according to claim 7, wherein:

the semiconductor material is silicon, and before providing the sacrificial layer, the method comprises the steps of:
 providing a silicon nitride layer on the substrate,
 structuring the silicon nitride layer such that in the hollow space spots of the silicon nitride layer remain,
 thermally oxidizing the substrate including the spots of the silicon nitride layer, so that under the spots of the silicon nitride layer spacers are formed from non-oxidized substrate material, to prevent an adhesion of the diaphragm region to the substrate during the deformation, and
 removing the silicon nitride layer.

13. The method according to claim 12, wherein before providing the sacrificial layer, the method comprises the step of:
 performing another thermal oxidizing to increasing a clearance between a tip of the at least one spacer and an upper edge of an oxide.

14. The method according to claim 10, wherein after the etching of the sacrificial layer, the method further comprises the steps of:
 depositing a sealing layer made of a material of the polycrystalline piezoresistive printed circuit traces on the layer including the material of the polycrystalline piezoresistive printed circuit traces, and
 structuring the sealing layer such that the etching channels are closed by plugs from the sealing layer.

15. The method according to claim 14, wherein:

the polycrystalline piezoresistive printed circuit traces, after the closing of the etching channels, are structured from the layer made of the material of the polycrystalline piezoresistive printed circuit traces.

* * * * *